US012787552B2

(12) United States Patent
Kim

(10) Patent No.: US 12,787,552 B2
(45) Date of Patent: Nov. 3, 2026

(54) DISPLAY APPARATUS

(71) Applicant: LG DISPLAY CO., LTD., Seoul (KR)

(72) Inventor: Bongjun Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 427 days.

(21) Appl. No.: 18/090,325

(22) Filed: Dec. 28, 2022

(65) Prior Publication Data

US 2023/0217729 A1 Jul. 6, 2023

(30) Foreign Application Priority Data

Dec. 30, 2021 (KR) ........................ 10-2021-0192391

(51) Int. Cl.
*H10K 59/122* (2023.01)
*H10K 59/80* (2023.01)
*H10K 59/35* (2023.01)

(52) U.S. Cl.
CPC ......... *H10K 59/122* (2023.02); *H10K 59/879* (2023.02); *H10K 59/35* (2023.02)

(58) Field of Classification Search
None
See application file for complete search history.

(56) References Cited

U.S. PATENT DOCUMENTS 9,583,739 B2 2/2017 Hirakata et al.
9,978,819 B2 5/2018 Jang et al.
10,069,114 B2 9/2018 Hirakata et al.
10,319,796 B2 6/2019 Jang et al.
10,608,063 B2 3/2020 Jang et al.
10,714,547 B2 7/2020 Heo
11,049,919 B2 6/2021 Jang et al.
11,552,275 B2 1/2023 Park et al.
11,910,682 B2 2/2024 Jeon et al.
2008/0024402 A1* 1/2008 Nishikawa ............. H05B 33/22 345/82
2010/0060148 A1 3/2010 Hwang et al.

(Continued)

FOREIGN PATENT DOCUMENTS

CN 1947464 A 4/2007
CN 104425558 A 3/2015

(Continued)

OTHER PUBLICATIONS

Office Action issued on Nov. 20, 2024 in corresponding Taiwanese Patent Application No. 113118639 (with partial English translation) (Note—US 2019/0006626 and CN 110010786 A cited in this TW Office Action were cited in prior IDSs.).

(Continued)

*Primary Examiner* — Kretelia Graham
*Assistant Examiner* — Nkechinyere Esiaba
(74) *Attorney, Agent, or Firm* — Morgan, Lewis & Bockius LLP

(57) ABSTRACT

A display apparatus may include: a substrate including a first sub-pixel area; an overcoat layer on the substrate and having a plurality of concave portions in the first sub-pixel area; and a bank layer on the overcoat layer and having a first opening to define a first light light-emitting area in the first sub-pixel area. The overcoat layer may include two first flat areas having a flat surface in the first light-emitting area, the concave portions being absent in the two first flat areas.

20 Claims, 4 Drawing Sheets

(56) References Cited

U.S. PATENT DOCUMENTS

| | | | |
|---|---|---|---|
| 2015/0060810 | A1 | 3/2015 | Han et al. |
| 2017/0125489 | A1 | 5/2017 | Jang et al. |
| 2018/0122874 | A1 | 5/2018 | Kim et al. |
| 2018/0247980 | A1 | 8/2018 | Jang et al. |
| 2018/0331316 | A1* | 11/2018 | Lee ...................... H10K 50/805 |
| 2019/0006557 | A1 | 1/2019 | Kim et al. |
| 2019/0006626 | A1 | 1/2019 | Kim et al. |
| 2019/0393448 | A1* | 12/2019 | Choi ................ H10K 59/80515 |
| 2019/0393450 | A1 | 12/2019 | Kim et al. |
| 2020/0058719 | A1* | 2/2020 | Yeon .................... H10K 59/124 |
| 2020/0144342 | A1* | 5/2020 | Shim ...................... H10K 50/15 |
| 2020/0185655 | A1 | 6/2020 | Jo et al. |
| 2020/0212275 | A1 | 7/2020 | Choi et al. |
| 2021/0183963 | A1 | 6/2021 | Jang et al. |
| 2021/0193969 | A1 | 6/2021 | Min et al. |
| 2021/0202628 | A1 | 7/2021 | Kim et al. |
| 2023/0217729 | A1 | 7/2023 | Kim |

FOREIGN PATENT DOCUMENTS

| | | | |
|---|---|---|---|
| CN | 109216419 | A | 1/2019 |
| CN | 110010644 | A | 7/2019 |
| CN | 110010786 | A | 7/2019 |
| CN | 111509007 | A | 8/2020 |
| CN | 113130575 | A | 7/2021 |
| CN | 113130598 | A | 7/2021 |
| EP | 4210451 | A1 | 7/2023 |
| JP | 2014-225438 | A | 12/2014 |
| KR | 10-2007-0017396 | A | 2/2007 |
| KR | 10-2017-0005248 | A | 1/2017 |
| KR | 10-2017-0036156 | A | 4/2017 |
| KR | 10-1951276 | B1 | 2/2019 |
| TW | 201721858 | A | 6/2017 |
| TW | 202445550 | A | 11/2024 |

OTHER PUBLICATIONS

Extended European Search Report, dated Jun. 12, 2023, issued in corresponding EP Patent Application No. 22217202.5.

Office Action issued on Sep. 3, 2024 in corresponding Japanese Patent Application No. 2022-207993 (with English translation). (Note—US 2019/0006626 A1 and JP 2014-225438 A cited in this JP Office Action were previously cited in prior IDSs.).

Office Action issued on Dec. 12, 2023, in corresponding Japanese Patent Application No. 2022-207993 (with English translation) (Note: US 2019/0006626 A1 was cited in a prior IDS.).

Office Action issued on Oct. 18, 2023, in corresponding Taiwanese Patent Application No. 111149846 (with English translation) (Note: US 2019/0006626 A1 was cited in a prior IDS.).

* cited by examiner

DISPLAY APPARATUS

CROSS-REFERENCE TO RELATED APPLICATION

This application claims priority and all the benefits accruing under 35 U.S.C. § 119 from Korean Patent Application No. 10-2021-0192391 filed on Dec. 30, 2021 in the Korean Intellectual Property Office, the entire contents of which are herein incorporated by reference.

BACKGROUND

Technical Field

The present disclosure relates to a display apparatus and, more particularly, to a display apparatus including a micro lens array.

Description of Related Art

As society enters full-fledged information age, various display apparatuses for processing and displaying a large amount of information have been developed. There are various types of display apparatuses that display images, such as a liquid crystal display (LCD) apparatus, an organic light-emitting display (OLED) apparatus, and a quantum dot display (QD) apparatus.

An organic light-emitting display apparatus has recently been spotlighted as a display apparatus and includes an organic light-emitting diode which emits light by itself. Thus, the OLED apparatus has a fast response speed, a high contrast ratio, luminous efficiency, and a wide viewing angle.

While the light emitted from an organic light-emitting layer of the OLED apparatus travels through various components of the OLED apparatus and is emitted out of the apparatus, a large portion of the emitted light may be lost. Thus, a portion of the light emitted out of the OLED apparatus may account for only about 20% of the light emitted from the organic light-emitting layer.

Therefore, in order to improve light extraction efficiency of the OLED apparatus, a scheme of forming a micro lens array inside a display panel of the organic light-emitting display apparatus has recently been proposed.

SUMMARY

Accordingly, embodiments of the present disclosure are directed to a display apparatus that substantially obviates one or more problems due to the limitations and disadvantages of the related art.

In a manufacturing process of an organic light-emitting display apparatus, a size of each of openings in a bank layer may be managed to be within a predefined range. Since the openings in the bank layer may define light-emitting areas, the size of each of the openings of the bank layer may be managed to be within a predefined target range such that light-emitting characteristics of the organic light-emitting display apparatuses manufactured on a manufacturing line may be uniform.

In particular, in an organic light-emitting display apparatus in which a micro lens array is formed inside the display panel, if the size of each of the openings in the bank layer is smaller than the predefined target range, the number of micro lenses contributing to light extraction may decrease and thus the light extraction efficiency may decrease.

To measure the sizes of the openings in the bank layer, an optical image of the bank layer may be photographed after the bank layer has been patterned. A gray level at each of both opposing sidewalls of an opening in the bank layer may be extracted from the photographed optical image, and the size of the opening may be measured based on the gray level and a predefined value.

If a micro lens array is formed inside the display panel of the organic light-emitting display apparatus, specifically on an overcoat layer disposed below the bank layer, the gray level at each of both opposing sidewalls of the opening in the bank layer extracted from the photographed optical images may be distorted. Thus, the size of the opening of the bank layer may not be accurately measured.

Accordingly, the inventors of the present disclosure have invented a display apparatus in which a size of each of openings in a bank layer may be accurately measured even where a micro lens array is formed on an overcoat layer inside a display panel.

An object of an embodiment of the present disclosure is to provide a display apparatus in which the size of the opening in the bank layer or a distance between the openings may be measured, thereby preventing decrease in light extraction efficiency.

The objects, features, and aspects of the present disclosure are not limited to those mentioned above. Additional objects, features, and aspects will be set forth in part in the description that follows and in part will become apparent to those skilled in the art from the description or may be learned by practice of the inventive concepts provided herein. Other objects, features, and aspects of the inventive concepts may be realized and attained by the structure particularly pointed out in, or derivable from, the written description, the claims hereof, and the appended drawings.

To achieve these and other advantages and in accordance with the purpose of the disclosure, as embodied and broadly described herein, a display apparatus may include: a substrate including a first sub-pixel area; an overcoat layer on the substrate and having a plurality of concave portions in the first sub-pixel area; and a bank layer on the overcoat layer and having a first opening to define a first light light-emitting area in the first sub-pixel area, wherein the overcoat layer may include two first flat areas having a flat surface in the first light-emitting area, the concave portions being absent in the two first flat areas.

In another aspect of the present disclosure, a display apparatus may include: a substrate including a first sub-pixel area and a second sub-pixel area; an overcoat layer on the substrate and having a plurality of concave portions in the first sub-pixel area and the second sub-pixel area; and a bank layer on the overcoat layer and including a first opening to define a first light-emitting area and a second opening to define a second light-emitting area, wherein the overcoat layer may include two first flat areas having a flat surface in the first light-emitting area, the concave portions being absent in the two first flat areas, and wherein at least one of the concave portions may be disposed under the bank layer adjacent to the second light-emitting area in the second sub-pixel area.

The specific details of other example embodiments are included in the detailed description and drawings.

According to an embodiment of the present disclosure, the flat areas without concave portions constituting the micro lens array may be disposed at the overcoat layer so as to overlap the sidewalls of the opening of the bank layer, respectively. Thus, a gray level at each of the sidewalls of the opening of the bank layer in the photographed optical image may not be distorted. Thus, the size of the opening of the bank layer or the distance between the openings may be measured accurately.

According to an embodiment of the present disclosure, the first and second flat areas without concave portions may be disposed at the overcoat layer such that the size of the opening in the bank layer or the distance between the openings may be measured. Thus, the size of the opening in the bank layer or the distance between the openings may be managed to be within a predefined target range. This may prevent or mitigate a potential decrease in the light extraction efficiency of the display apparatus.

Effects of the present disclosure are not limited to the above-mentioned effects, and other effects may be clearly understood by those skilled in the art from following descriptions.

It is to be understood that both the foregoing general description and the following detailed description of the present disclosure are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION

Figure 1:
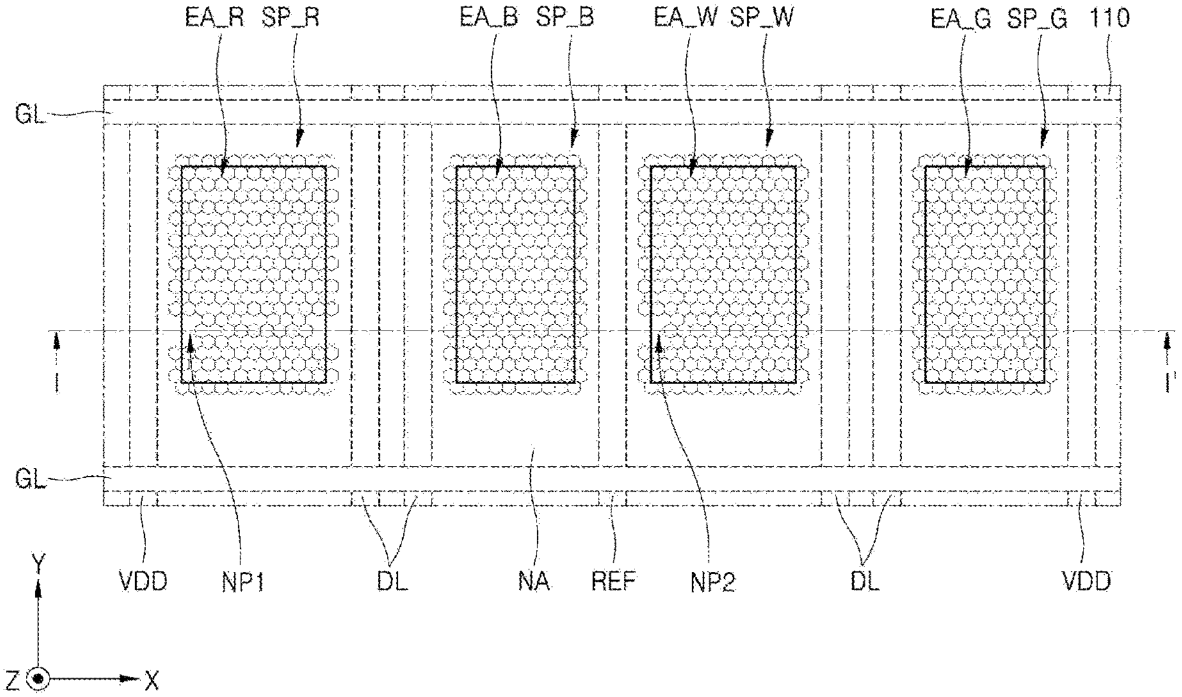
FIG. 1 is a plan view showing one pixel area of an organic light-emitting display apparatus according to an example embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example embodiments of the present disclosure, are merely given by way of example. Therefore, the present disclosure is not limited to such example illustrations in the drawings. The same reference numerals refer to the same elements herein, unless otherwise specified.

In the following description, where the detailed description of the relevant known function or configuration may unnecessarily obscure a feature or aspect of the present disclosure, a detailed description of such known function or configuration may be omitted. Furthermore, in the following detailed description of the present disclosure, numerous specific details may be set forth in order to provide a thorough understanding of the present disclosure. However, it will be understood that the present disclosure may be practiced without some of these specific details. In other instances, well-known methods, procedures, components, and circuits may not be described in detail so as not to unnecessarily obscure aspects of the present disclosure.

The terminology used herein is directed to the purpose of describing particular embodiments only and is not intended to be limiting of the present disclosure.

An element described in the singular form is intended to include a plurality of elements, and vice versa, unless the context clearly indicates otherwise. Also, the terms "comprise," "have," "include," and the like are used describe the presence of the stated features, integers, operations, elements, and/or components, but do not preclude the presence or addition of one or more other features, integers, operations, elements, components, and/or portions thereof, unless a more limiting term, such as "only," is used.

As used herein, the term "and/or" includes any and all combinations of one or more of the associated listed items.

In construing a numerical value of an element, the element is to be construed as including an error or tolerance range even where no explicit description of such an error or tolerance range is provided.

Where an element or layer is referred to as being "on," "connected to," or "coupled to" another element or layer, it should be understood to mean that the element or layer may be directly on, directly connected to, or directly coupled to the other element or layer, or that intervening elements or layers may be present, unless otherwise specified. Also, where one element is referred to as being disposed "on" or "under" another element, it should be understood to mean that the elements may be so disposed to directly contact each other, or may be so disposed without directly contacting each other, unless otherwise specified. In addition, where an element or layer is referred to as being "between" two other elements or layers, it may be the only element or layer between the two other elements or layers, or one or more intervening elements or layers may also be present, unless otherwise specified.

Where positional relationships are described, for example, where the positional relationship between two parts or elements is described using "on," "over," "under," "above," "below," "beside," "next," or the like, one or more other parts or elements may be located between the two stated parts or elements unless a more limiting term, such as "immediate(ly)," "direct(ly)," or "close(ly)" is used. For example, where an element or layer is disposed "on" or "on top of" another element or layer, a third layer or element may be interposed therebetween.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

Features of various embodiments of the present disclosure may be partially or entirely coupled to or combined with each other. They may be linked and operated technically in various ways as those skilled in the art can sufficiently understand. The embodiments may be carried out independently of or in association with each other in various combinations.

Where a temporal relationship between processes, operations, flows, steps, events, or the like is described as, for example, “after,” “subsequent,” “next,” or “before,” the relationship encompasses not only a continuous or sequential order but also a non-continuous or non-sequential relationship unless a more limiting term, such as “just,” “immediate(ly),” or “direct(ly),” is used.

Unless otherwise defined, all terms including technical and scientific terms used herein have the same meaning as commonly understood by one of ordinary skill in the art to which the present disclosure is related. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Hereinafter, a display apparatus according to example embodiments of the present disclosure will be described in detail with reference to the accompanying drawings.

Figure 2:
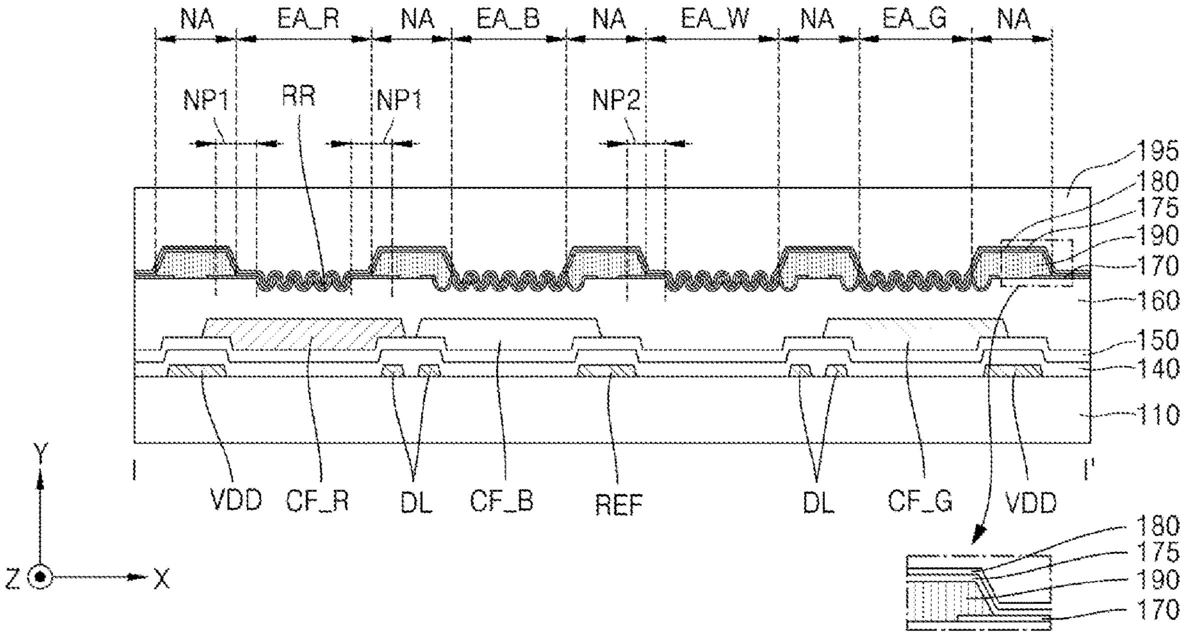
FIG. 2 is a cross-sectional view showing a cross section of the example organic light-emitting display apparatus cut along a I-I' cut line in FIG. 1.
Figure 3:
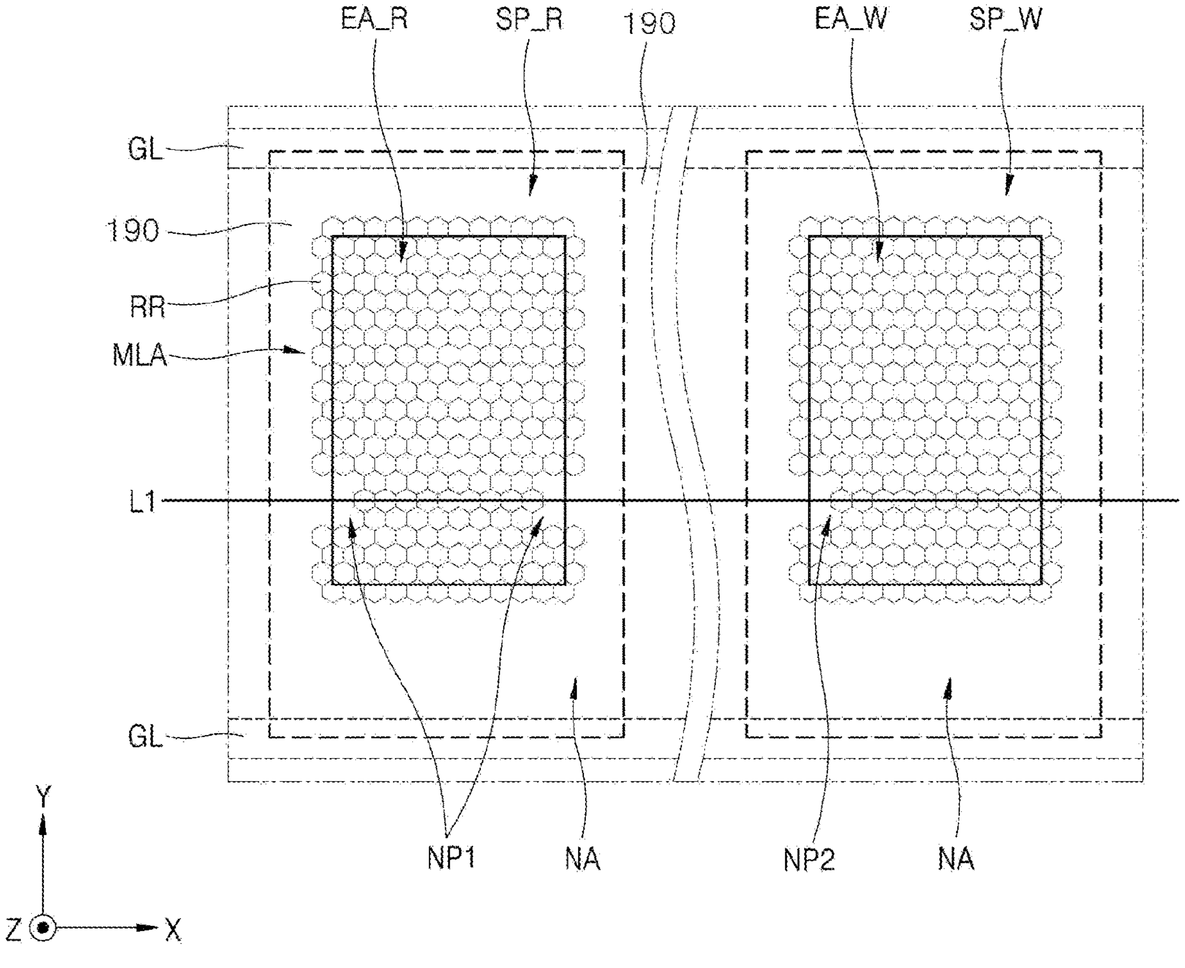
FIG. 3 is a plan view showing two sub-pixel areas of an organic light-emitting display apparatus according to an example embodiment of the present disclosure.

FIG. 1 is a plan view showing one pixel area of an organic light-emitting display apparatus according to an example embodiment of the present disclosure. FIG. 2 is a cross-sectional view showing a cross section of the example organic light-emitting display apparatus cut along a I-I' cut line in FIG. 1. FIG. 3 is a plan view showing two sub-pixel areas of an organic light-emitting display apparatus according to an example embodiment of the present disclosure.

As shown in FIGS. 1-3, signal lines including gate lines GL, data lines DL, reference lines REF, and driving voltage lines VDD may be disposed on the substrate 110. The gate line GL may be arranged to intersect the data line DL, the reference line REF, and the driving voltage line VDD.

According to this example embodiment, on the substrate 110, a red sub-pixel area SP_R, a blue sub-pixel area SP_B, a white sub-pixel area SP_W, and a green sub-pixel area SP_G may be defined by the above-described signal lines.

For example, each of the red sub-pixel area SP_R and the green sub-pixel area SP_G may be defined by two gate lines GL extending parallel to each other, and a driving voltage line VDD and a data line DL intersecting the gate lines. Further, each of the white sub-pixel area SP_W and the blue sub-pixel area SP_B may be defined by two gate lines GL extending parallel to each other, and a data line DL and a reference line REF intersecting the gate lines. Each of the red sub-pixel area SP_R and the white sub-pixel area SP_W may have a larger area size than that of each of the blue sub-pixel area SP_B and the green sub-pixel area SP_G. An arrangement order of the sub-pixel areas and types and the number of the signal lines extending between the sub-pixel areas are not limited to those in the illustrated example and may be modified as appropriate in other embodiments. A size of each of the sub-pixel areas may also be changed and is not limited to that in the illustrated example.

The red sub-pixel area SP_R, the blue sub-pixel area SP_B, the white sub-pixel area SP_W, and the green sub-pixel area SP_G defined on the substrate 110 may include a red light-emitting area EA_R, a blue light-emitting area EA_B, a white light-emitting area EA_W, and a green light-emitting area EA_G, respectively. Areas other than the red light-emitting area EA_R, the blue light-emitting area EA_B, the white light-emitting area EA_W, and the green light-emitting area EA_G may belong to a non-light-emitting area NA. In this regard, the red light-emitting area EA_R, the blue light-emitting area EA_B, the white light-emitting area EA_W, and the green light-emitting area EA_G may not be covered with the bank layer 190. That is, the remaining areas excluding the red light-emitting area EA_R, the blue light-emitting area EA_B, the white light-emitting area EA_W, and the green light-emitting area EA_G, that is, the non-light-emitting area NA, may be covered with the bank layer 190. Each of the red light-emitting area EA_R and the white light-emitting area EA_W may have a larger area size than each of the blue light-emitting area EA_B and the green light-emitting area EA_G.

A plurality of concave portions RR may be disposed in each of the sub-pixel areas SP_R, SP_B, SP_W, and SP_G. The plurality of concave portions RR may be regularly arranged to constitute a micro lens array MLA. The plurality of concave portions RR may be arranged in, for example, a honeycomb shape to constitute the micro lens array MLA. The plurality of concave portions RR may be arranged in each of a plurality of rows adjacent to each other. The plurality of concave portions RR may also be disposed in each of the light-emitting areas EA_R, EA_B, EA_W, and EA_G and in the non-light-emitting area NA adjacent to each of the light-emitting areas. In the concave portions RR of two adjacent rows, a partial area of at least one concave portion among the outermost concave portions may not be covered with the bank layer 190.

The number of the concave portions RR in each of the sub-pixel areas SP_R, SP_B, SP_W, and SP_G is not limited to that shown in FIGS. 1 to 3. The number of the concave portions RR may be larger than the number of the concave portions RR shown in the drawings. Further, the number of the concave portions RR disposed in the non-light-emitting area NA is not limited to that shown in FIGS. 1 to 3. The number of the concave portions RR disposed in the non-light-emitting area NA may be larger than that shown in the drawings.

A pair of first flat areas NP1 may be disposed in the red sub-pixel area SP_R, and a second flat area NP2 may be disposed in the white sub-pixel area SP_W. Each of the first flat areas NP1 and the second flat area NP2 may refer to an area in which the concave portions RR are not formed.

The first flat areas NP1 may be disposed in the red light-emitting area EA_R and may extend out of the red light-emitting area EA_R, that is, to the non-light-emitting area NA adjacent to the red light-emitting area EA_R. The second flat area NP2 may be disposed in the white light-emitting area EA_W and may extend out of the white light-emitting area EA_W, that is, to the non-light-emitting area NA adjacent to the white light-emitting area EA_W. In other words, the first flat areas NP1 may be disposed across the red light-emitting area EA_R and the non-light-emitting area NA adjacent to the red light-emitting area EA_R, and the second flat area NP2 may be disposed across the white light-emitting area EA_W and the non-light-emitting area NA adjacent to the white light-emitting area EA_W.

A reason for having the pair of the first flat areas NP1 disposed in the red light-emitting area EA_R and the second flat area NP2 disposed in the white light-emitting area EA_W is that a size of each of the red light-emitting area EA_R and the white light-emitting area EA_W is larger than a size of each of the blue light-emitting area EA_B and the green light-emitting area EA_G. Thus, reduction in the light extraction efficiency of each of the red light-emitting area EA_R and the white light-emitting area EA_W due to the formation of the flat areas NP1 and NP2 in which the concave portions RR are not formed is relatively smaller compared to that in each of the blue light-emitting area EA_B and the green light-emitting area EA_G. As will be described later, the plurality of concave portions RR may be regularly arranged to constitute the micro lens array MLA, thereby contributing to improvement of light extraction efficiency of each of the sub-pixel areas. The number of concave portions RR that may contribute to the improvement of light extraction efficiency may be reduced in a proportional manner to a size of an area by which the flat areas NP1 and NP2 are formed.

The pair of the first flat areas NP1 may be located along the same line. For example, as shown in FIG. 3, the pair of the first flat areas NP1 may be located along one straight line L1 extending in a first direction (X-axis direction) in which the gate line GL extends. The pair of the first flat areas NP1 and the second flat area NL2 may be located along the same line. The pair of the first flat areas NP1 and the second flat area NL2 may be located along a single straight line L1 extending in the first direction (X-axis direction).

As illustrated in FIG. 2, on the substrate 110, the data line DL, the reference line REF, the driving voltage line VDD, a buffer layer 140, a passivation layer 150, color filters CF_R, CF_G, and CF_B, an overcoat layer 160, a bank layer 190, first electrodes 170, an organic light-emitting layer 175 and a second electrode 180 may be disposed.

The data line DL, the reference line REF, and the driving voltage line VDD may be located on the substrate 110. In addition, the buffer layer 140 may cover the data line DL, the reference line REF, and the driving voltage line VDD. The buffer layer 140 may be formed by, for example, stacking a plurality of inorganic layers. For example, the buffer layer 140 may be embodied as a multilayer in which two or more inorganic layers made of a silicon oxide layer ($SiO_x$), a silicon nitride layer ($SiN_x$), or a silicon oxynitride layer (SiON) may be stacked. The buffer layer 140 may be formed on an entire top surface of the substrate 110 to block moisture from invading the organic light-emitting element through the substrate 110. A driving thin-film transistor may be disposed on the buffer layer 140.

The passivation layer 150 may be disposed on the buffer layer 140, and the passivation layer 150 may protect the data line DL, the reference line REF, the driving voltage line VDD, and a driving thin-film transistor (not shown). The passivation layer 150 may be made of an inorganic insulating material, such as silicon oxide and silicon nitride, or an organic insulating material, such as photoacryl or benzocyclobutene.

The color filters CF_R, CF_B, and CF_G may be disposed on the passivation layer 150. A red color filter CF_R may be located in the red light-emitting area EA_R, a blue color filter CF_B may be located in the blue light-emitting area EA_B, and a green color filter CF_G may be located in the green light-emitting area EA_G. No color filter is in the white light-emitting area EA_W in this example. In the white light-emitting area EA_W, white light emitted from the organic light-emitting layer 175 may be emitted out through the substrate 110 while a wavelength of the emitted white light is maintained.

The overcoat layer 160 may be positioned on the passivation layer 150 and cover the color filters CF_R, CF_B, and CF_G. The overcoat layer 160 may planarize irregularities caused by the color filters CF_R, CF_B, CF_G, and the like. The overcoat layer 160 may be made of an organic-based insulating material, such as photoacryl or benzocyclobutene. At a top surface of the overcoat layer 160, the plurality of concave portions RR may be formed in each sub-pixel area. The plurality of concave portions RR may be regularly arranged to constitute the micro lens array MLA. Accordingly, light extraction efficiency of each sub-pixel area may be improved. In addition, a portion of the overcoat layer 160 in each of the red light-emitting area EA_R and the white light-emitting area EA_W may respectively include the first and second flat areas NP1 and NP2 in which the concave portions RR are not disposed.

A first electrode 170 may be disposed on the overcoat layer 160 in each of the sub-pixel areas. The first electrode 170 may cover the plurality of concave portions RR in each sub-pixel area. A portion of the first electrode 170 disposed in the red sub-pixel area SP_R may include first flat electrode areas respectively corresponding to the first flat areas NP1. A portion of the first electrode 170 disposed in the white sub-pixel area SP_W may include a second flat electrode area corresponding to the second flat area NP2. The first electrode 170 may be electrically connected to a source electrode or a drain electrode of the driving thin-film transistor (not shown) in each sub-pixel area.

The bank layer 190 may cover an edge of each of the first electrodes 170 so as to define each of the light-emitting areas of the sub-pixel areas. The bank layer 190 may cover the concave portions RR disposed in the non-light-emitting area NA.

The organic light-emitting layer 175 and the second electrode 180 may be sequentially stacked on the bank layer 190 and the first electrode 170. The organic light-emitting layer 175 may emit white light. The first electrode 170, the organic light-emitting layer 175, and the second electrode 180 may constitute an organic light-emitting element, but the present disclosure is not limited to the illustrated example embodiment. For example, in other embodiments, an organic light-emitting element may include multiple light-emitting layers between the first electrode 170 and the second electrode 180.

The pair of the first flat areas NP1 may be respectively disposed in two opposing side edges of the opening of the bank layer 190 defining the red light-emitting area EA_R. The first flat areas NP1 may be partially disposed in the red light-emitting area EA_R and extend out of the red light-emitting area EA_R, that is, under the bank layer in the non-light-emitting area NA. The pair of the first flat areas NP1 may respectively overlap two opposing sidewalls of the opening of the bank layer 190 defining the red light-emitting area EA_R. The second flat area NP2 may be disposed in one side of an opening of the bank layer 190 defining the white light-emitting area EA_W. The second flat area NP2 may be partially disposed in the white light-emitting area EA_W and extend out of the white light-emitting area EA_W, that is, under the bank layer in the non-light-emitting area NA. The second flat area NP2 may overlap one sidewall of the opening of bank layer 190 defining the white light-emitting area EA_W.

Therefore, according to an example embodiment of the present disclosure, the first and second flat areas without concave portions may be included in the overcoat layer so as to overlap the sidewalls of the openings in the bank layer, respectively. Thus, a gray level at each of these sidewalls of the opening in the bank layer in the photographed optical image may not be distorted. Thus, the size of the opening of the bank layer or the distance between the openings may be measured more accurately.

Further, the first and second flat areas without concave portions may be included in the overcoat layer such that the size of the opening in the bank layer or the distance between the openings may be measured. Thus, the size of the opening in the bank layer or the distance between the openings may be managed to be within a predefined target range. This may prevent or mitigate a potential decrease in the light extraction efficiency of the display apparatus.

It has been described above that the first flat areas NP1 may be disposed in the red sub-pixel area SP_R and the second flat area NP2 may be disposed in the white sub-pixel area SP_W. However, the present disclosure is not limited thereto. Positions of the first flat areas NP1 and the second flat area NP2 may be changed in other embodiments, based on the sizes of the sub-pixel areas.

Figure 4:
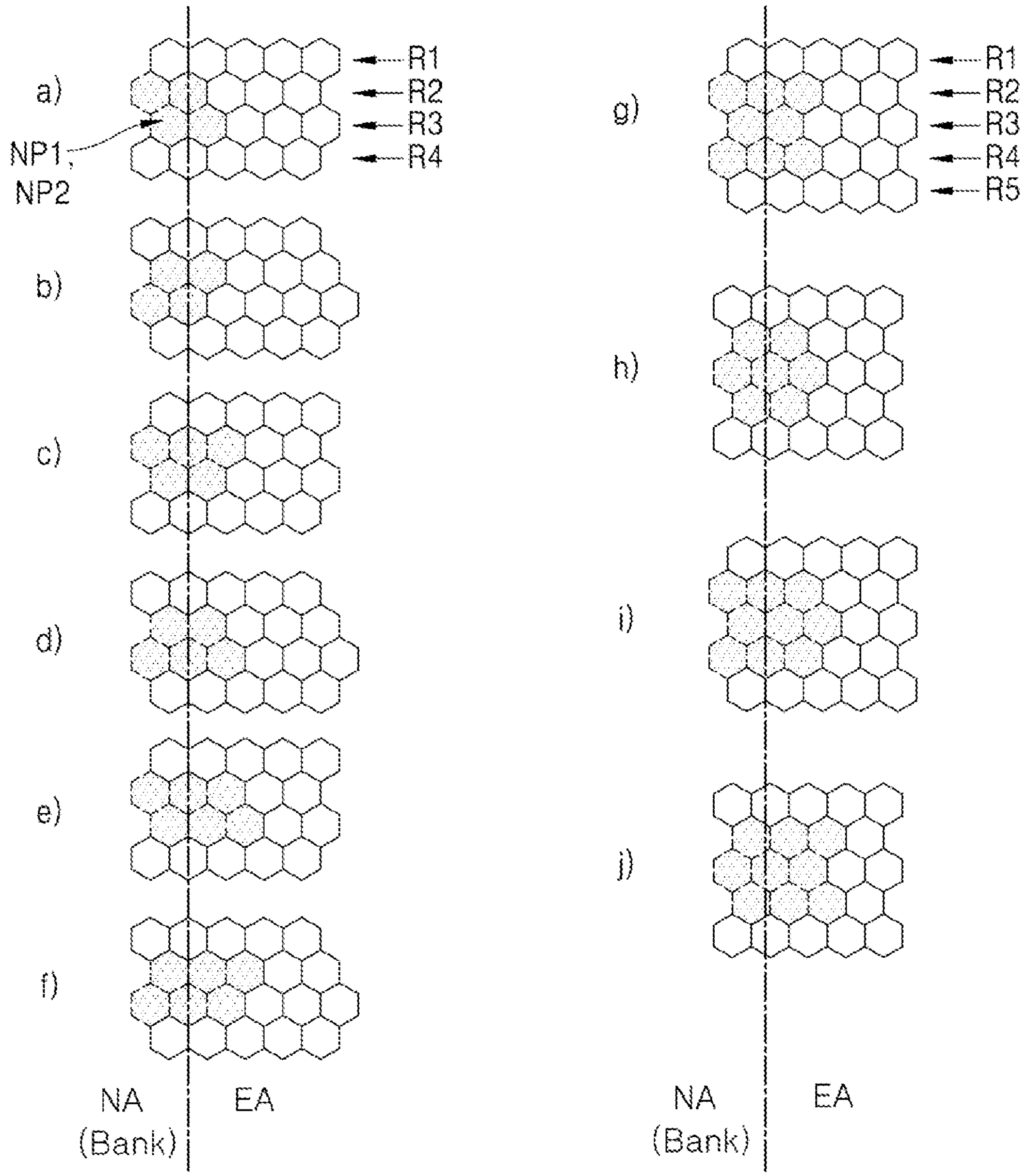
FIG. 4 shows forms of first and second flat areas according to example embodiments of the present disclosure.

FIG. 4 shows forms of the first and second flat areas according to example embodiments of the present disclosure. For convenience of illustration, FIG. 4 shows only the first and second flat areas NP1 and NP2 and some concave portions RR around the first and second flat areas.

As shown in FIG. 4, each of the first flat areas NP1 and the second flat area NP2 may correspond to two or three rows R2, R3, and R4 of the plurality of concave portions RR.

Each of the first flat areas NP1 and the second flat area NP2 may have an area size equal to or greater than four times of an area size of one concave portion RR. In one example, an area size of each of the first flat area NP1 and the second flat area NP2 may be greater than or equal to a sum of area sizes of four concave portions and may be smaller than or equal to a sum of area sizes of nine concave portions. The first flat areas NP1 and the second flat area NP2 may have the same shape and area size as each other. However, the present disclosure is not limited thereto.

In FIG. 4, the shapes and the area sizes of the first flat areas NP1 and the second flat area NP2 are illustrated by way of examples. However, the present disclosure is not limited thereto.

An example display apparatus in which one pixel area includes four sub-pixel areas, that is, the red sub-pixel area SP_R, the green sub-pixel area SP_G, the white sub-pixel area SP_W, and blue sub-pixel area SP_B has been described above. However, the present disclosure is not limited thereto. For example, the present disclosure may be applied to a display apparatus in which one pixel area includes three sub-pixel areas, for example, a red sub-pixel area, a green sub-pixel area, and a blue sub-pixel area.

Various example embodiments of the present disclosure may be described as follows.

A display apparatus according to an example embodiment of the present may include: a substrate including a first sub-pixel area; an overcoat layer on the substrate and having a plurality of concave portions in the first sub-pixel area; and a bank layer on the overcoat layer and having a first opening to define a first light light-emitting area in the first sub-pixel area. The overcoat layer may include at least one first flat area having a flat surface in the first light-emitting area, the concave portions being absent in the at least one first flat area.

In some example embodiments, the two first flat areas may be spaced apart from each other in a first direction with at least one of the concave portions interposed between the two first flat areas.

In some example embodiments, the display apparatus may further include a gate line on the substrate, the gate line extending in the first direction.

In some example embodiments, the two first flat areas may be respectively disposed at two opposite ends of the first light-emitting area in the first direction.

In some example embodiments, the two first flat areas may extend out of the first light-emitting area and may overlap a portion of the bank layer adjacent to the first light-emitting area.

In some example embodiments, the two first flat areas may have an area size equal to or greater than 4 times an area size of one of the concave portions.

In some example embodiments, the display apparatus may further include a light-emitting element on the overcoat layer in the first light-emitting area, the light emitting element including a first electrode, a light-emitting layer on the first electrode, and a second electrode on the light-emitting layer.

In some example embodiments, the first electrode may be on the two first flat areas and at least one of the concave portions in the first light-emitting area, and the two first flat areas and the first electrode may be partially disposed under a portion of the bank layer adjacent to the first light-emitting area.

In some example embodiments, the substrate may further include a second sub-pixel area spaced apart from the first sub-pixel area. The overcoat layer may further include a plurality of concave portions in the second sub-pixel area. The bank layer may further include a second opening to define a second light-emitting area in the second sub-pixel area. The overcoat layer may include a second flat area having a flat surface in the second light-emitting area, the concave portions in the second sub-pixel area being absent in the second flat area.

In some example embodiments, the second flat area may extend out of the second light-emitting area and may overlap a portion of the bank layer adjacent to the second light-emitting area.

In some example embodiments, the second flat area may have an area size equal to or greater than 4 times of an area size of one of the concave portions in the second sub-pixel area.

In some example embodiments, the display apparatus may further include a gate line on the substrate, the gate line extending in a first direction, wherein the two first flat areas and the second flat area may be located along a same straight line extending in the first direction.

In some example embodiments, at least one of the concave portions in the second sub-pixel area may be disposed under a portion of the bank layer adjacent to the second light-emitting area.

In some example embodiments, the substrate may further include a third sub-pixel area being between the first sub-pixel area and the second sub-pixel area, the overcoat layer may further include a plurality of concave portions in the third sub-pixel area, the bank layer may further include a third opening to define a third light-emitting area in the third sub-pixel area, and the third light-emitting area of the third sub-pixel does not have any flat area in the overcoat layer and is fully covered by a plurality of concave portions.

In another example embodiment of the present disclosure, a display apparatus may include: a substrate including a first sub-pixel area and a second sub-pixel area; an overcoat layer on the substrate and having a plurality of concave portions in the first sub-pixel area and the second sub-pixel area; and a bank layer on the overcoat layer and including a first opening to define a first light-emitting area and a second opening to define a second light-emitting area. The overcoat layer may include two first flat areas having a flat surface in the first light-emitting area, the concave portions being absent in the two first flat areas. At least one of the concave portions may be disposed under the overcoat layer adjacent to the second light-emitting area in the second sub-pixel area.

In some example embodiments, the first sub-pixel area and the second sub-pixel area are adjacent to each other.

In some example embodiments, two first flat areas are disposed respectively at two opposite ends of the first light emitting area, at least one of the concave portions being interposed between the two first flat areas.

In some example embodiments, the two first flat areas may extend out of the first light-emitting area and may overlap a portion of the bank layer adjacent to the first light-emitting area.

In some example embodiments, the substrate may further include a third sub-pixel area, the second sub-pixel area being between the first sub-pixel area and the third sub-pixel. The overcoat layer may further include a plurality of concave portions in the third sub-pixel area. The bank layer may further include a third opening to define a third light-emitting area in the third sub-pixel area. The overcoat layer may include a second flat area with a flat surface in the third light-emitting area, the concave portions in the third sub-pixel area being absent in the second flat area.

In some example embodiments, the first sub-pixel area may be a red sub-pixel area, and the second sub-pixel area may be one of a blue sub-pixel area or a green sub-pixel area.

The above description has been presented to enable any person skilled in the art to make and use the various possible embodiments of the present disclosure. Although the example embodiments of the present disclosure have been described in more detail with reference to the accompanying drawings, the present disclosure is not limited thereto and may be embodied in many different forms without departing from the technical concept of the present disclosure. Therefore, the example embodiments disclosed in the present disclosure are provided for illustrative purposes only and are not intended to limit the technical concept of the present disclosure.

It will be apparent to those skilled in the art that various modifications and variations can be made in the present disclosure without departing from the spirit or scope of the disclosures. Thus, it is intended that protected scope of the present disclosure cover such modifications and variations of this disclosure, provided that they come within the scope of the appended claims and their equivalents.

What is claimed is:

1. A display apparatus, comprising:

a substrate including a first sub-pixel area;

an overcoat layer on the substrate and having a plurality of concave portions in the first sub-pixel area; and a bank layer on the overcoat layer and having a first opening to define a first light-emitting area in the first sub-pixel area, wherein the overcoat layer includes two first flat areas having a flat surface in the first light-emitting area, the concave portions being absent in the two first flat areas, wherein, in a plan view, the two first flat areas are spaced apart from each other in a first direction with at least one of the concave portions interposed between the two first flat areas, wherein, in the plan view, an edge of the bank layer extending in a second direction intersecting the first direction overlaps one of the two first flat areas and overlaps two or more of the concave portions in the first sub-pixel area, and wherein, in the plan view, the one of the two first flat areas is interposed in the second direction between two concave portions that are next to each other and entirely spaced apart from each other in the second direction, among the two or more of the concave portions in the first sub-pixel area, the one of the two first flat areas and the two concave portions being overlapped by the edge of the bank layer extending in the second direction.

2. The display apparatus of claim 1, further comprising a gate line on the substrate, the gate line extending in the first direction.

3. The display apparatus of claim 1, wherein the two first flat areas are respectively disposed at two opposite ends of the first light-emitting area in the first direction.

4. The display apparatus of claim 1, wherein each of the two first flat areas extends out of the first light-emitting area and overlaps a portion of the bank layer adjacent to the first light-emitting area.

5. The display apparatus of claim 1, wherein each of the two first flat areas has an area size equal to or greater than 4 times an area size of one of the concave portions.

6. The display apparatus of claim 1, further comprising:

a light-emitting element on the overcoat layer in the first light-emitting area, the light-emitting element including a first electrode, a light-emitting layer on the first electrode, and a second electrode on the light-emitting layer.

7. The display apparatus of claim 6, wherein the first electrode is on the two first flat areas and at least one of the concave portions in the first light-emitting area, and wherein the two first flat areas and the first electrode are partially disposed under a portion of the bank layer adjacent to the first light-emitting area.

8. The display apparatus of claim 1, wherein:

the substrate further includes a second sub-pixel area spaced apart from the first sub-pixel area, the overcoat layer further includes a plurality of concave portions in the second sub-pixel area, the bank layer further includes a second opening to define a second light-emitting area in the second sub-pixel area, the overcoat layer includes a second flat area having a flat surface in the second light-emitting area, the concave portions in the second sub-pixel area being absent in the second flat area, and the overcoat layer includes more flat areas overlapped by edges of the first opening in the bank layer than overlapped by edges of the second opening in the bank layer.

9. The display apparatus of claim 8, wherein the second flat area extends out of the second light-emitting area and overlaps a portion of the bank layer adjacent to the second light-emitting area.

10. The display apparatus of claim 8, wherein the second flat area has an area size equal to or greater than 4 times of an area size of one of the concave portions in the second sub-pixel area.

11. The display apparatus of claim 8, further comprising a gate line on the substrate, the gate line extending in a first direction, wherein the two first flat areas and the second flat area are located along a same straight line extending in the first direction.

12. The display apparatus of claim 8, wherein;

the substrate further includes a third sub-pixel area being between the first sub-pixel area and the second sub-pixel area, the overcoat layer further includes a plurality of concave portions in the third sub-pixel area, the bank layer further includes a third opening to define a third light-emitting area in the third sub-pixel area, and the overcoat layer in the third light-emitting area of the third sub-pixel area does not have any flat area, and the third light-emitting area is fully covered by the plurality of concave portions so that, in a straight line along the first direction, the overcoat layer has a different cross-sectional shape in the third light-emitting area from a cross-sectional shape in at least one of the first light-emitting area and the second light-emitting area.

13. A display apparatus, comprising:

a substrate including a first sub-pixel area and a second sub-pixel area;

an overcoat layer on the substrate and having a plurality of concave portions in the first sub-pixel area and the second sub-pixel area; and a bank layer on the overcoat layer and including a first opening to define a first light-emitting area and a second opening to define a second light-emitting area, wherein the overcoat layer includes two first flat areas having a flat surface in the first light-emitting area, the concave portions being absent in the two first flat areas, wherein, in a plan view, one of the two first flat areas in the first light-emitting area is interposed between two of the concave portions next to each other and entirely spaced apart from each other along a first edge of the first opening, the first edge of the first opening overlapping the one of the two first flat areas and the two of the concave portions, and wherein the overcoat layer has more flat areas with a flat upper surface, where the concave portions are absent, overlapped by edges of the first opening than overlapped by edges of the second opening, the edges of the first opening including the first edge of the first opening.

14. The display apparatus of claim 13, wherein the first sub-pixel area and the second sub-pixel area are adjacent to each other.

15. The display apparatus of claim 13, wherein the two first flat areas are disposed respectively at two opposite ends of the first light-emitting area, at least one of the concave portions being interposed between the two first flat areas.

16. The display apparatus of claim 13, wherein the two first flat areas extend out of the first light-emitting area and overlaps a portion of the bank layer adjacent to the first light-emitting area.

17. The display apparatus of claim 13, wherein:

the substrate further includes a third sub-pixel area, the second sub-pixel area being between the first sub-pixel area and the third sub-pixel area, the overcoat layer further includes a plurality of concave portions in the third sub-pixel area, the bank layer further includes a third opening to define a third light-emitting area in the third sub-pixel area, the overcoat layer includes a second flat area with a flat surface in the third light-emitting area, the concave portions in the third sub-pixel area being absent in the second flat area, and the overcoat layer has more flat areas overlapped by the edges of the first opening than overlapped by edges of the third opening in the bank layer.

18. The display apparatus of claim 13, wherein the first sub-pixel area is a red sub-pixel area, and the second sub-pixel area is one of a blue sub-pixel area or a green sub-pixel area.

19. The display apparatus of claim 1, wherein two adjacent concave portions among the plurality of concave portions are connected to each other to form a pointed peak between the two adjacent concave portions.

20. The display apparatus of claim 1, wherein at least one of the plurality of concave portions is disposed under the bank layer adjacent to the first light-emitting area.

* * * * *